(12) United States Patent
Maazouz

(10) Patent No.: US 9,087,672 B2
(45) Date of Patent: Jul. 21, 2015

(54) FOCUSED ION BEAM LOW KV ENHANCEMENT

(71) Applicant: FEI Company, Hillsboro, OR (US)

(72) Inventor: Mostafa Maazouz, Hillsboro, OR (US)

(73) Assignee: FEI COMPANY, Hillsboro, OR (US)

( * ) Notice: Subject to any disclaimer, the term of this patent is extended or adjusted under 35 U.S.C. 154(b) by 0 days.

(21) Appl. No.: 14/565,051

(22) Filed: Dec. 9, 2014

(65) Prior Publication Data

US 2015/0083929 A1      Mar. 26, 2015

Related U.S. Application Data

(63) Continuation of application No. 13/779,142, filed on Feb. 27, 2013, now Pat. No. 8,933,414.

(51) Int. Cl.
| | |
|---|---|
| *H01J 3/07* | (2006.01) |
| *H01J 37/08* | (2006.01) |
| *H01J 49/10* | (2006.01) |
| *H01J 49/26* | (2006.01) |
| *H01J 37/147* | (2006.01) |
| *H01J 37/06* | (2006.01) |
| *H01J 37/248* | (2006.01) |

(52) U.S. Cl.
CPC ............. *H01J 37/1477* (2013.01); *H01J 37/06* (2013.01); *H01J 37/248* (2013.01); *H01J 2237/0473* (2013.01); *H01J 2237/31749* (2013.01)

(58) Field of Classification Search
CPC ............ H01J 37/244; H01J 2237/0268; H01J 2237/2448; H01J 2237/31749; H01J 37/05; H01J 37/28; H01J 49/0086; H01J 49/488; H01J 37/10
USPC ............. 250/310, 306, 307, 396 R, 305, 397; 315/111.81, 111.61
See application file for complete search history.

(56) References Cited

U.S. PATENT DOCUMENTS

| | | | | |
|---|---|---|---|---|
| 7,339,167 | B2 * | 3/2008 | Ohshima et al. | 250/310 |
| 8,933,414 | B2 * | 1/2015 | Maazouz | 250/396 R |
| 2013/0327952 | A1 * | 12/2013 | Maazouz et al. | 250/396 R |

* cited by examiner

*Primary Examiner* — Nikita Wells
(74) *Attorney, Agent, or Firm* — Scheineberg & Associates, PC; Michael O. Scheinberg; John E. Hillert

(57) ABSTRACT

The invention provides a charged particle beam system wherein the middle section of the focused ion beam column is biased to a high negative voltage allowing the beam to move at higher potential than the final beam energy inside that section of the column. At low kV potential, the aberrations and coulomb interactions are reduced, which results in significant improvements in spot size.

23 Claims, 6 Drawing Sheets

FOCUSED ION BEAM LOW KV ENHANCEMENT

This application is a continuation of U.S. patent Ser. No. 13/779,142 filed Feb. 27, 2013, which is hereby incorporated by reference.

TECHNICAL FIELD OF THE INVENTION

The present invention relates to charged particle beam systems, such as a focused ion beam system.

BACKGROUND OF THE INVENTION

Focused ion beam systems direct charged particles onto a work piece, or target, for processing the work piece or for forming an image of the work piece. Charged particle beam systems are used, for example, in integrated circuit fabrication and other nanotechnology processing. Charged particles beam systems typically include a source of particles, a beam blanker, accelerating lenses, focusing optics, and deflection optics.

High resolution focused ion beams (FIBs) have proven useful for a variety of tasks such as microscopy, lithography, micromachining (ion milling and material deposition), and dopant implantation. Over the years, a number of ion sources have been developed for focused ion beam applications, including gas-phase field ionization, plasma, and liquid metals. Of all the sources developed to date, the liquid metal ion source (LMIS) has proven the most useful and is in the most widespread use today. The usefulness of the liquid metal ion source stems fundamentally from its very high brightness which allows the production of focused ion beams with spot sizes on the order of 10 nm while maintaining currents in the range of 1 pA to 10 pA. These characteristics give focused ion beams the necessary resolution and ion currents to perform a range of state of the art nanotechnology tasks.

Despite their widespread use, existing ion sources possess limitations that impede progress toward broader applications and higher resolution. The use of focused ion beams with high landing energies at the target, which is above 5 keV, can cause significant damage to the work piece. However, the use of beams with low landing energy results in poor spot size performances needed to make thin lamellas.

Accordingly, a need exists for an improved system and strategy for a focused ion beam with low keV landing energy but effective spot sizes. Focused ion beams with improvements in low keV can be achieved with low CC objective lens or tetrode/pentode switchable lenses.

The higher the immersion ratio, the stronger the cathode lens becomes. Axial aberration coefficients drop significantly with increasing immersion ratio k. For example, the coefficient of chromatic aberration CC, which has a major impact on resolution at low landing energies, is almost inversely proportional to the immersion ratio k. This leads to partial compensation for the beam diameter deterioration at low beam energy seen in the cases where beam deceleration is not used. But the performance improvements in using low CC objective lenses and tetrode/pentode switchable lenses is very small and not sufficient for imaging and creating ultrathin lenses.

Furthermore, it is difficult to accelerate ions from a source without inducing a large energy spread in the resultant beam. The larger the spatial extent of the ion source, the more difficult it is to focus the ions to a point. Improvements in the system are required to produce smaller probe sizes and produce the resolution that such systems are theoretically capable of producing.

The focusing optics focus the beam into a spot or a predefined shape on the surface of a target. Focusing optics typically include a combination of condenser lenses and an objective lens. The lens can be electrostatic, magnetic, or various combinations of the two. Charged particle lenses, like light lenses, have aberrations that prevent the particles from being focused to a shape image. The aberration is least for charged particles passing through the center of the lens, and the aberration increases as the distance from the center of the lens increases. It is desirable, therefore, for the charged particle beam to pass very near the center of the lens. One type of aberration, referred to as "beam interaction" occurs because the particles in the beam, all having the same electrical charge, repel each other. The closer the particles are to each other, the greater the repulsive force. Because the particles are typically converging after passing through the objective lens, it is desirable to position the objective lens as close as possible to the work piece, to reduce the time that the particles are focused in a tight beam. The distance between the objective lens and the work piece is referred to as the "working distance."

The deflection optics direct the beam to points, referred to as "dwell points" or "pixels," on the surface of the work piece. For example, the beam may be directed in a raster pattern, in a serpentine pattern, or toward an arbitrary sequence of individual points. The beam will typically dwell at a point for a specified period, referred to as "dwell period," to deliver a specified "dose" of charged particles, and then be deflected to the next dwell point. The duration of the dwell period is referred to as the "dwell time" or the "pixel rate." (While pixel "rate" more properly refers to the number of pixels scanned per second, the term is also used to indicate the time the beam remains at each pixel.)

The deflection optics can be magnetic or electrostatic. In focused ion beam systems, the deflection optics are typically electrostatic. Electrostatic deflectors for focused ion beam are typically octupoles, that is, each deflector includes eight plates, distributed around the circumference of a circle. Different voltages are applied to the eight plates to deflect the beam away from the optical axis in different directions.

If the deflector is placed below the objective lens, the beam can pass through the center of the objective lens to minimize aberration. Such a configuration is used, for example, in the VisION System sold by FEI Company, the assignee of the present invention. Placing the deflector below the objective lens, however, increases the working distance, thereby increasing the beam aberration.

To minimize the working distance, one can place the deflector above the objective lens. With the deflector above the lens, however, when the beam is deflected, it is moved away from the center of the lens, thereby increasing certain aberrations. To solve this problem, many focused ion beam systems use a two stage deflectors.

What is needed is a focused ion beam that can achieve the necessary optimum spot sizes to work on ultrathin lamellas without the high landing energy at the target.

SUMMARY OF THE INVENTION

An object of the invention is to provide a method and apparatus for forming a focused ion beam spot size that is substantially improved from conventional spot sizes using low kV.

This invention consists of biasing the middle section of the FIB column to a high negative voltage allowing the beam to move at higher potential than the final beam energy inside that section of the column, which helps reduce aberrations and coulomb interactions. The result is significant improvement in spot size at the low kV.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

The invention produces significant improvements in spot sizes produced by a focused ion beam by biasing the middle section of focused ion beam column to high negative voltages, and is particularly useful when in making ultrathin lamellas.

Figure 2:
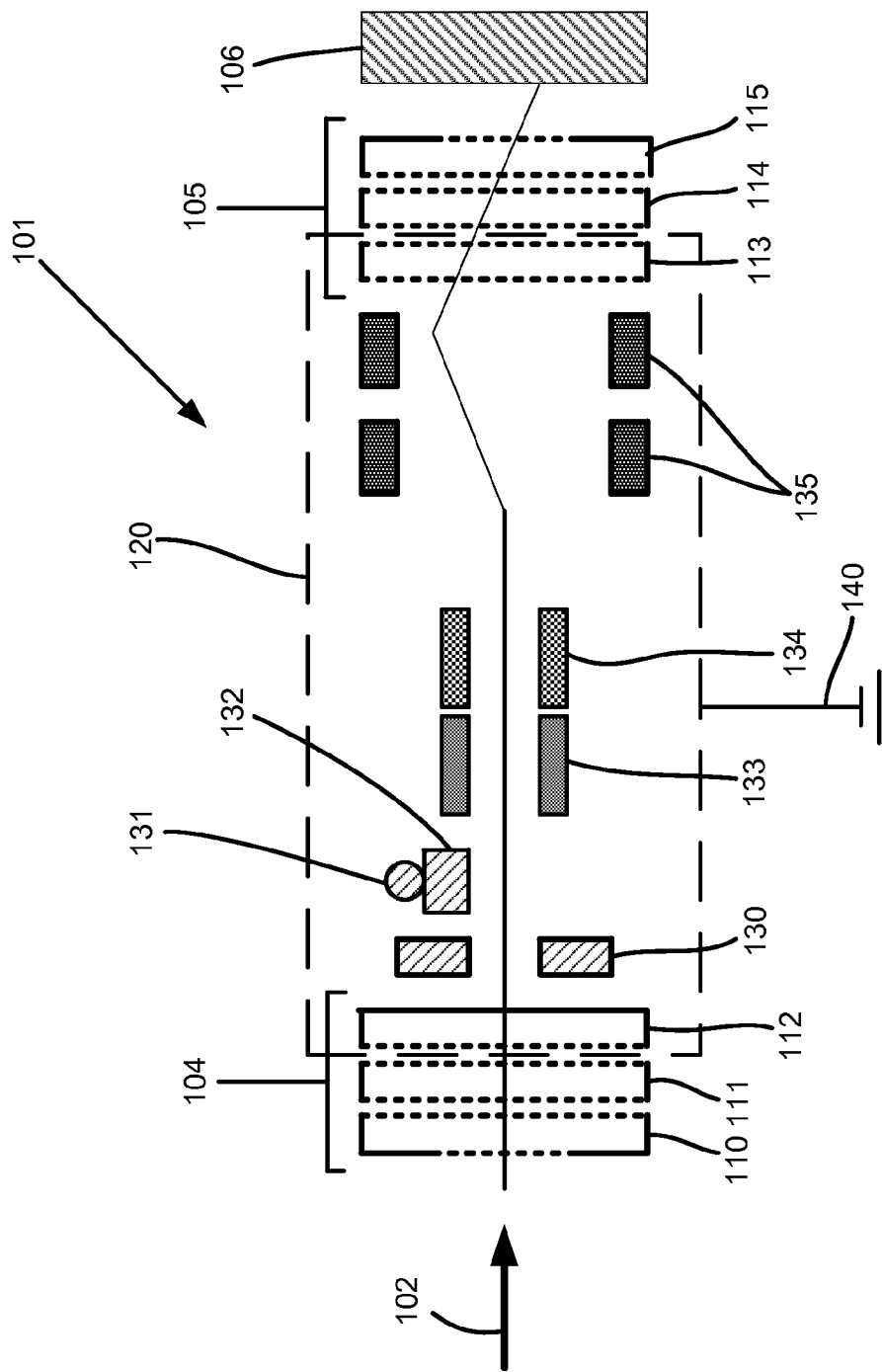
FIG. 2 shows a schematic cross-sectional view of a focused ion beam having a booster tube.

FIG. 2 shows a focused ion beam column 101 having a source of electrons 102 in accordance with embodiments of the current invention. The source of electrons 102 has a beam pathway 103 that traverses the length of the focused ion beam column 101 and is directed to a target 106. The focused ion beam column 101 is comprised of two lens systems 104, 105. Lens system 104 is composed of three lenses 110, 111, and 112. Lens system 105 is composed of three lenses 113, 114, and 115.

In accordance with embodiments of the current invention, the middle section of the focused ion beam column 101 is composed of a booster tube 120. The booster tube may be composed of a tube that encapsulates the middle components of the focused ion beam column 101. The tube of the booster tube 120 can be made of a variety of materials, such as titanium alloy, that allows the components inside the tube to be electrically insulated from ground potential. The booster tube 120 does not necessarily have to be composed of a physical tube. It can also refer to a system comprising the middle section of the focused ion beam column 101 wherein the middle section can be set to a higher voltage level. In FIG. 2, the booster tube 120 is made up of the lens 112, beam defining aperture (BDA) 130, Differential Pumping Aperture (DPA) 131 of the Column Isolation Valve (CIV) 132, the steering poles 133, blanking plates and Faraday cup 134, scan octopole 135, and lens 113.

The term beam defining aperture (BDA) is usually used to describe the disk shaped element itself as well as the hole, or aperture. The aperture in the BDA is significantly small and allows only small fraction of the original beam to pass through to the target 106. The DPA 131 is placed in the column that enables operation of the apparatus with different vacuum levels in the vacuum chamber and the column. A CIV 132 may be present to seal off and protect the ion source and focusing column apparatus in the event of chamber vacuum loss. A beam blanker gives the option to blank the beam so no ions can hit the work piece. Ion beam current can be measured using optional faraday cup 134. The focused ion beam is scanned across the surface of target 106 by scanning plates 135.

Figure 1A:
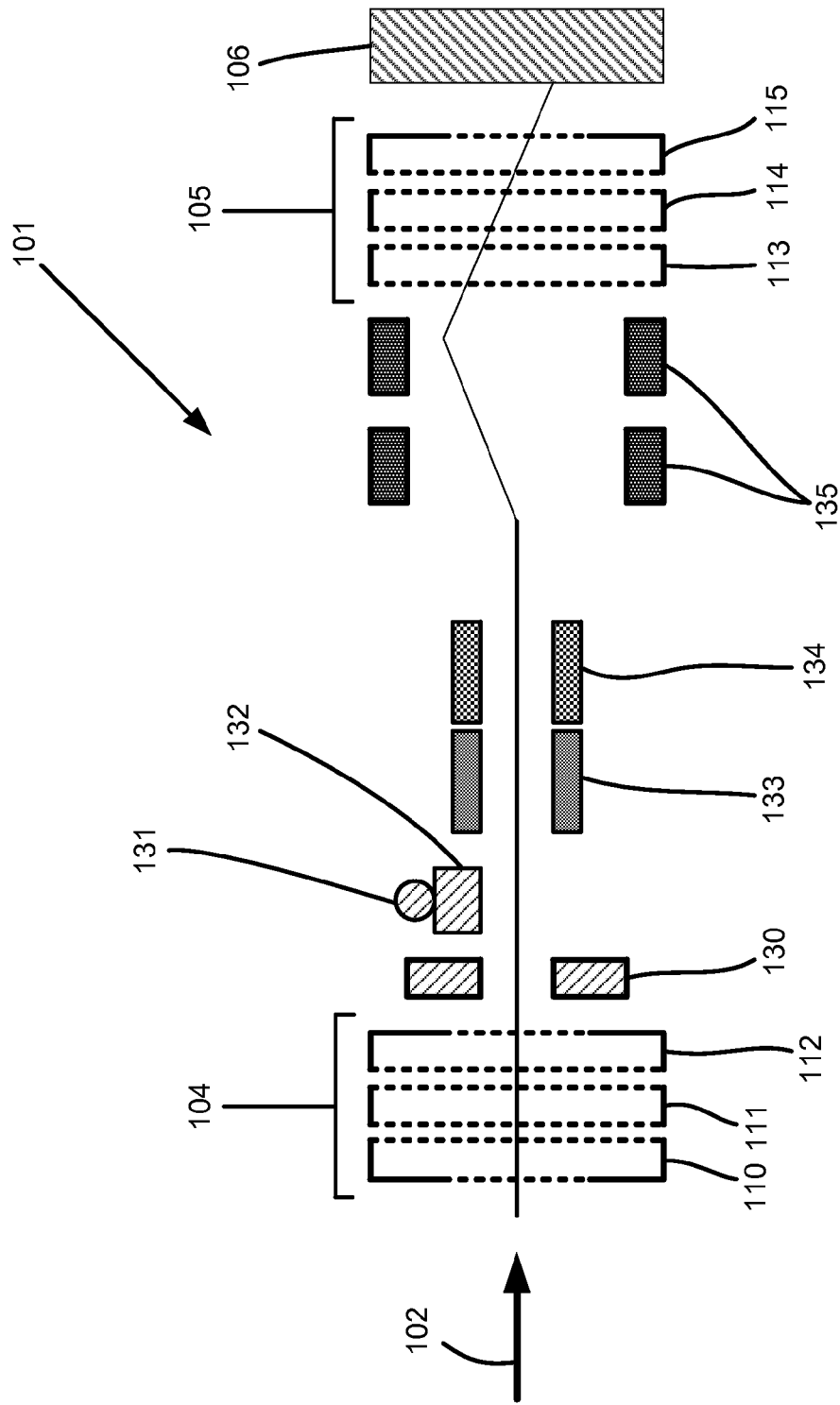
FIG. 1A shows a schematic cross-sectional view of a typical focused ion beam system.
Figure 1B:
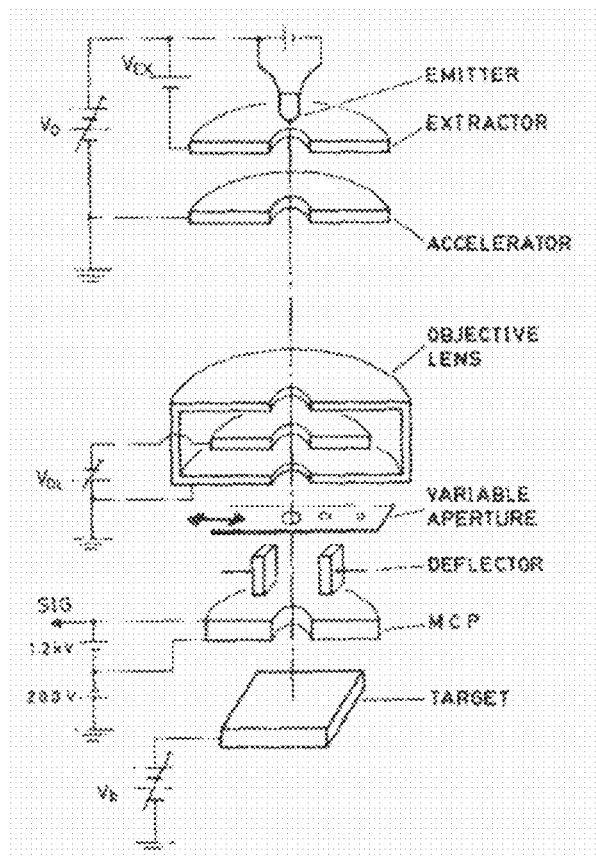
FIG. 1B shows a typical focused ion beam system that contains a middle section that is grounded.

Generally, in prior art focused ion beam columns, the middle section of the focused ion beam column 101 is grounded to 0V. This is shown in FIG. 1A, where no booster tube exists. As further shown in FIG. 1B, the conventional system has components of the focused ion beam column, such as the objective lens and deflector where the components are grounded.

In accordance with embodiments of the current invention, the booster tube 120 is biased to a high negative voltage allowing the beam to move at a higher potential than the final beam energy. The booster tube 120 and the components must be electrically insulated from ground. The booster tube 120 allows for the last lens 112 of the lens system 104, the BDA 130, DPA 131, the CIV 132, the steering poles 133, blanking plates and Faraday cup 134, scan octopole 135, and first lens 113 of the lens system 105 to be set a higher voltage than conventional systems that generally set the voltage to ground.

The eventual spot size on target 106 is reduced when the booster tube 120 is used. Charged ions repel each other and the ions will acquire velocity components normal to the beam axis when traveling down the focused ion column 101. By raising the voltage within the middle section of the focused ion tube 101, the ions experience a smaller energy spread and ultimately results in a higher resolution at the target 106.

Most focused ion beam application requires ions to be accelerated to a few keV. When ions are accelerated over a long distance using conventional electrostatic electrodes, then the area of these electrodes will have to be on the order of the square of the distance separating them in order to ensure field uniformity. If lensing induces the ions to come to a focus along the beam path before the target (a so-called 'cross-over') then inter-ion Coulomb forces will reduce the quality of the ion beam and again result in a larger spot size when the beam is re-focused. By biasing the middle section of the focused ion beam to a higher potential voltage, the system reduces the undesirable cross-over effect and reduce the Coulomb forces, which substantially improves the spot size at target 106.

Embodiments of the invention address these problems and produce a high resolution beam by using a booster tube 120. The higher the energy, the more damage that results at target 106. It is preferable to reduce the energy level at the landing energy. As shown in each of these figures, the spot size is substantially improved with the use of higher voltages that is applied to the booster tube 120.

Figure 3A:
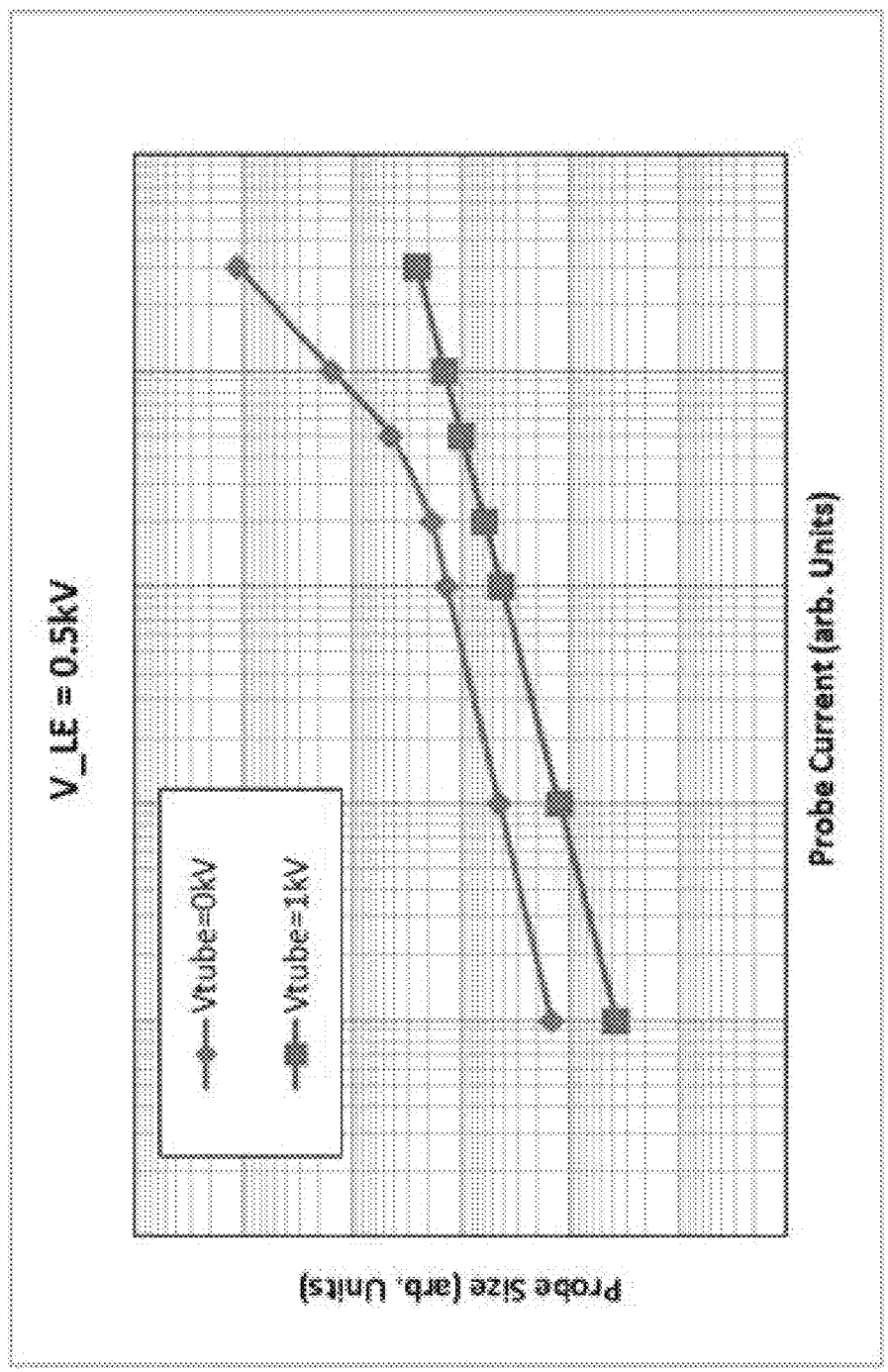
FIGS. 3A-3C are graphs showing the relationship between probe size and probe current in systems having a booster tube vs. systems without a booster tube.
Figure 3B:
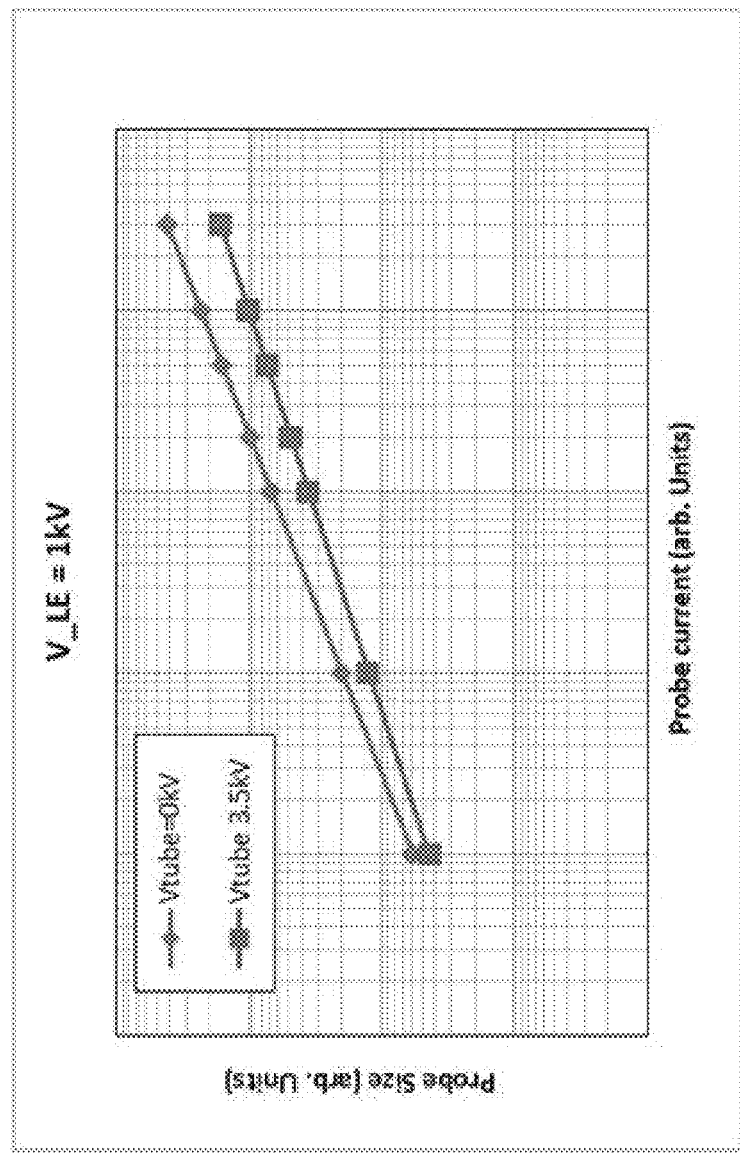
Figure 3C:
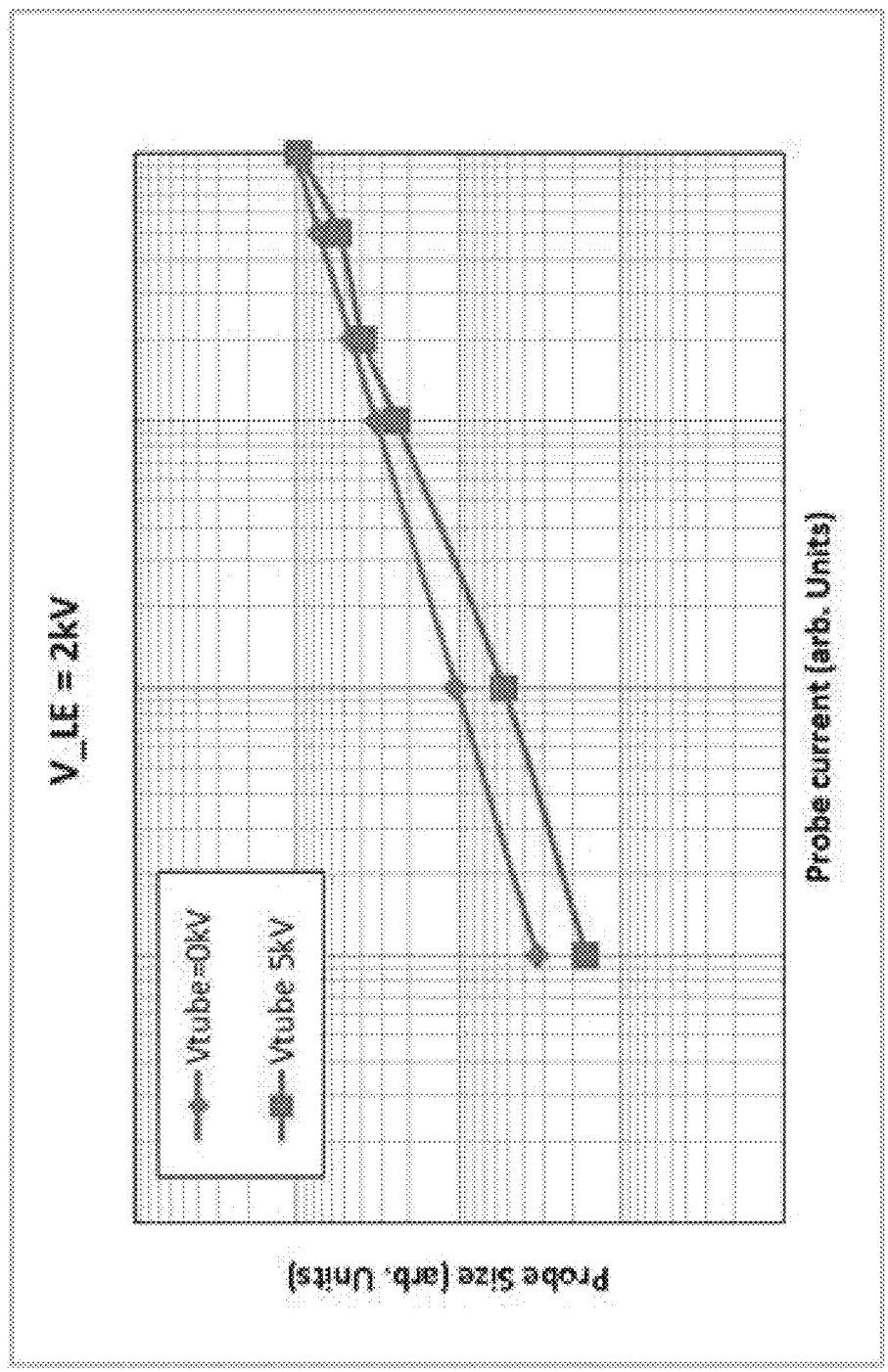

FIGS. 3A, 3B, and 3C show the relationship between the probe size and the probe current at the different booster tube energy levels. As shown, in each instance, the use of a booster tube drastically reduces the spot size at the target. The booster tube 120 is biased to a high negative voltage with a high negative voltage module 140. Such high negative voltage modules are known in the industry, such as the Spellman HVPS. In accordance with embodiments of the current invention, the usage of a low landing energy system, such a 0.5 keV landing energy with the application of a booster tube set to high negative voltage, such as a high negative voltage module biased to 1 kV is disclosed. Such a system would be minimally damaging to the target while at the same time producing a usable spot size. As such, the booster tube 120 allows the use with low energy, i.e., energy under 5 kV.

The focused ion beam column 101 can be used in two modes depending on the beam energy. The first mode is a high kV mode, where the landing energy is above 5 kV and where the booster tube is grounded. In a second mode, the column operates with a low kV mode, which is generally under 5 kV landing energy where the booster tube 120 is biased to the appropriate voltage, which is directly tied up or float at the bias voltage. The focused ion beam column takes into consideration of these different modes and follows an alignment procedure in accordance with them.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

I claim:

1. A charged particle beam system, comprising:
a source of charged particles;
a charged particle beam focusing column configured to focus the charged particles into a charged particle beam, wherein components of a middle section of the charged particle beam focusing column includes a scanning electrostatic deflector configured to scan the charged particle beam across a surface of the target; and
voltage module configured to reduce a spot size of the charged particle beam on the surface by applying a floating bias voltage to the components.

2. The charged particle beam system of claim 1, wherein the voltage module is configured to reduce a spot size of the charged particle beam by raising a difference in electrical potential between the middle section and the work piece.

3. The charged particle beam system of claim 1, further comprising an optical axis that extends from the source of charged particles and traverses a length of the charged particle beam focusing column, and wherein the charged particle beam focusing column further comprises a lens disposed downstream of the scanning electrostatic deflector along the optical axis.

4. The charged particle beam system of claim 1, wherein the charged particle beam focusing column is a focused ion beam column, the charged particle beam is a focused ion beam, and the floating bias voltage comprises a negative voltage.

5. The charged particle beam system of claim 4, wherein the floating bias voltage comprises a negative voltage between 0 and −5 kV.

6. The charged particle beam system of claim 5, wherein the negative voltage is in a range of from −1 kV to −3 kV.

7. The charged particle beam system of claim 4, wherein the scanning electrostatic deflector comprises a scan octupole.

8. The charged particle beam system of claim 1, wherein the source of charged particles comprises a source of electrons.

9. A charged particle beam system, comprising:
a source of charged particles;
a charged particle beam column configured to direct a charged particle beam comprising the charged particles from the source onto a target, wherein a middle section of the charged particle beam column includes a booster tube containing a scanning electrostatic deflector configured to scan the charged particle beam across a surface of the target; and
a voltage module configured to reduce a spot size of the charged particle beam by applying a floating bias voltage to the booster tube as the charged particle beam traverses a length of the charged particle column along an optical axis extending from the source to the target.

10. The charged particle beam system of claim 9, wherein the voltage module is configured to reduce a spot size of the charged particle beam on the surface by applying a floating bias voltage to the booster tube such that the charged particle beam moves at a higher kinetic energy inside the middle section than at the surface.

11. The charged particle beam system of claim 9, wherein:
the charged particle beam column further comprises a lens disposed downstream of the scanning electrostatic deflector along an optical axis extending from the source to the target.

12. The charged particle beam system of claim 9, wherein the charged particle beam column is a focused ion beam column, the charged particle beam is a focused ion beam, and applying the floating bias voltage to the booster tube comprises applying a negative voltage to the booster tube.

13. The charged particle beam system of claim 9, wherein the booster tube encapsulates middle components of the charged particle beam column and the scanning electrostatic deflector is one of the middle components.

14. The charged particle beam system of claim 13, wherein the booster tube electrically insulates the middle components from ground potential.

15. The charged particle beam system of claim 14, wherein a material of the booster tube electrically insulates the middle components from ground potential.

16. The charged particle beam system of claim 9, wherein the booster tube and other components of the charged particle beam column are electrically insulated from ground.

17. The charged particle beam system of claim 9, wherein the booster tube comprises components of the charged particle beam column and is not comprised of a physical tube.

18. A method for imaging and/or processing a target using a charged particle beam, the method comprising:
directing a charged particle beam along an optical axis of a charged particle beam column that extends from a source of charged particles toward a target; and
reducing a spot size of the charged particle beam on the target by applying a floating bias voltage to components of a middle section of the charged particle beam column, wherein the components comprise a scanning electrostatic deflector configured to scan the charged particle beam across a surface of the target.

19. The method of claim 18, wherein reducing a spot size of the charged particle beam on the target comprises applying a floating bias voltage to the components such that the charged particle beam moves at a higher kinetic energy inside the middle section than at the surface.

20. The method of claim 16, wherein the charged particle beam column comprises a lens disposed downstream of the scanning electrostatic deflector along the optical axis, and further comprising directing the charged particle beam through the scanning electrostatic deflector and the lens.

21. The method of claim 19, wherein the charged particle beam column comprises a focused ion beam column, the charged particle beam is a focused ion beam, and the floating bias voltage comprises a negative voltage between zero and −5 kV.

22. The method of claim 20, wherein the negative voltage is in a range of from −1 kV to −3 kV.

23. A charged particle beam system, comprising:

a source of charged particles;

a charged particle beam column configured to focus and direct a beam of the charged particles along a path extending from the source to a target, the charged particle beam column comprising a middle section, a scanning electrostatic deflector located in the middle section configured to direct the charged particle beam to points on a surface of the target, and a lens disposed downstream of the scanning electrostatic deflector along the optical axis;

a voltage module configured to increase a difference in electrical potential between the middle section and the target by applying a floating bias voltage to the middle section, wherein raising the difference in electrical potential reduces a spot size of the beam on the target.

* * * * *